(12) United States Patent
Hung et al.

(10) Patent No.: US 7,966,543 B2
(45) Date of Patent: Jun. 21, 2011

(54) CYCLIC COMPARISON METHOD FOR LOW-DENSITY PARITY-CHECK DECODER

(75) Inventors: Jui-Hui Hung, Tainan (TW); Jui-Hung Hung, Tainan (TW); Sau-Gee Chen, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 1034 days.

(21) Appl. No.: 11/741,693

(22) Filed: Apr. 27, 2007

(65) Prior Publication Data

US 2008/0222499 A1 Sep. 11, 2008

(30) Foreign Application Priority Data

Mar. 9, 2007 (TW) .............................. 96108173 A

(51) Int. Cl.
*H03M 13/00* (2006.01)
(52) U.S. Cl. ...................................... 714/752; 714/801
(58) Field of Classification Search .................. 714/752, 714/801
See application file for complete search history.

(56) References Cited

U.S. PATENT DOCUMENTS

| | | | |
|---|---|---|---|
| 7,017,106 B2 | 3/2006 | Shen et al. | |
| 7,137,060 B2 * | 11/2006 | Yu et al. | 714/794 |
| 7,246,304 B2 * | 7/2007 | Kim | 714/801 |
| 7,376,885 B2 * | 5/2008 | Richardson et al. | 714/758 |
| 7,644,339 B2 * | 1/2010 | Tran et al. | 714/758 |
| 7,730,377 B2 * | 6/2010 | Hocevar | 714/752 |

OTHER PUBLICATIONS

M. Karkooti, et al, Semi-parallel Reconfigurable Architectures For Real-Time LDPC Decoding. ITCC '04.

* cited by examiner

*Primary Examiner* — Esaw T Abraham
(74) *Attorney, Agent, or Firm* — Muncy, Geissler, Olds & Lowe, PLLC

(57) ABSTRACT

A cyclic comparison method for an LDPC decoder. The nth element of the input k elements, wherein n=1, . . . , k, is sequentially removed by the corresponding comparator to obtain k first level sequences. Next, pairs of two elements selected from the k elements are used to form k second level sequences. The preceding step is repeated $k \times \lceil \log_2(k-1) \rceil$ times to obtain k output results. Either of one first level sequences and one output results contains (k−1) elements. The first level sequences are compared with the output results to determine whether they are identical. If they are identical, the process stops. If they are not identical, the abovementioned step is repeated to obtain new output results. The cyclic comparison method of the present invention needs only $k \times \lceil \log_2(k-1) \rceil$ comparisons to obtain output results. Thus, the present invention can reduce the number of basic operations and can apply to any input number.

10 Claims, 4 Drawing Sheets

CYCLIC COMPARISON METHOD FOR LOW-DENSITY PARITY-CHECK DECODER

BACKGROUND OF THE INVENTION

1. Field of the Invention

The present invention relates to a technology of a low-density parity-check (LDPC) code for a transmission channel, particularly to a cyclic comparison method for an LDPC decoder.

2. Description of the Related Art

The low-density parity-check (LDPC) code is a promising and very useful encoding technology with highly complicated calculation. The Min-Sum algorithm thereof can greatly reduce the hardware complexity of a decoder. However, a little performance loss may occur in the operation thereof. Therefore, it is an important subject how to reduce operational complexity via the Min-Sum algorithm without the penalty of performance.

The operation of an LDPC decoder is an iterative process. Refer to FIG. 1 a flowchart of the decoding process of an LDPC decoder. As shown in FIG. 1, the decoder is initialized firstly in Step S10; next, check nodes and bit nodes are respectively updated in Step S12 and Step S14; then, in Step S16, it is checked whether the iteration number exceeds a predetermined maximum iteration number or whether the decoded information bits satisfies the check matrix constraint: $Hx^T=0$; if the result is positive, the decoded bits are output, and the process ends, as shown in Step S18; it the result is negative, the process returns to Step S12 to repeat the updates of the check nodes and the bit nodes. From the foregoing description, it is known that the check node unit (CNU) has a great influence on the decoder. The conventional technologies cannot apply to an arbitrary input number of a CNU but can only get an optimal result for a specified input number. In the conventional technologies, the greater the input number, the more the comparisons. Thus, the comparators need increasing, and the CNU operation speed slows down, which will consume more resource. Besides, the conventional technologies did not propose the detailed method for optimizing comparators, which makes them hard to outstand.

Accordingly, the present invention proposes a cyclic comparison method for an LDPC decoder to solve the abovementioned problems.

SUMMARY OF THE INVENTION

The primary objective of the present invention is to provide a cyclic comparison method for an LDPC decoder, wherein the cyclic comparison algorithm can be easily programmed, can approach the optimal solution and can accept any number of inputs in a low-density parity-check process.

Another objective of the present invention is to provide a cyclic comparison method for an LDPC decoder, wherein via the large set intersection between the compared level sequences, k input elements need only $k \times \lceil \log_2(k-1) \rceil$ comparisons; thereby, the number of calculations can be reduced and the efficiency of the system is promoted.

Further another objective of the present invention is to provide a cyclic comparison method for an LDPC decoder, wherein when the number of the input elements is k, each element of the input elements is sequentially removed from the input elements to form k first level sequences, and each first level sequences has (k−1) elements; pairs of two elements selected from the k elements are used to form k level sequences, and pairs of two level sequences selected from the k level sequences are used to form a plurality of level sequences; the preceding step is repeated until obtaining k output results with each output results has (k−1) elements; the first level sequences and the output results are compared to determine whether they are identical; thereby, a fast comparison is achieved.

To achieve the abovementioned objectives, the present invention proposes a cyclic comparison method for an LDPC decoder, wherein k elements are input to a CNU for comparison. The cyclic comparison method for an LDPC decoder of the present invention comprises the following steps: (a) sequentially removing the elements respectively at from the first position to the kth position to obtain k first level sequences with each first level sequences having (k−1) elements, and outputting the first level sequences and the minimum value of each first level sequences; (b) utilizing pairs of two elements sequentially selected from the k elements input to the CNU to form k second level sequences, and utilizing pairs of two second level sequences sequentially selected from the k second level sequences to form k third level sequences; (c) utilizing pairs of two third level sequences selected from the k third level sequences to form a plurality level sequences, and repeating the step until obtaining k output results with each output results containing (k−1) elements; and (d) comparing the output results obtained in Step (c) and the first level sequences obtained in Step (a) to determine whether they are identical; if they are identical, stopping the process and outputting the minimum value of each output results; if they are not identical, doing Step (c) again to obtain new output results.

Below, the embodiments are to be described in detail to make the objectives, technical contents, characteristics and accomplishments of the present invention easily understood.

DETAILED DESCRIPTION OF THE INVENTION

The present invention pertains to a cyclic comparison method for an LDPC decoder, which reduces the number of comparison operations via working out the largest common comparison set under the condition without changing the shortest critical path of the comparison operation, and which can also fast work out the result for any input number.

Figure 1:
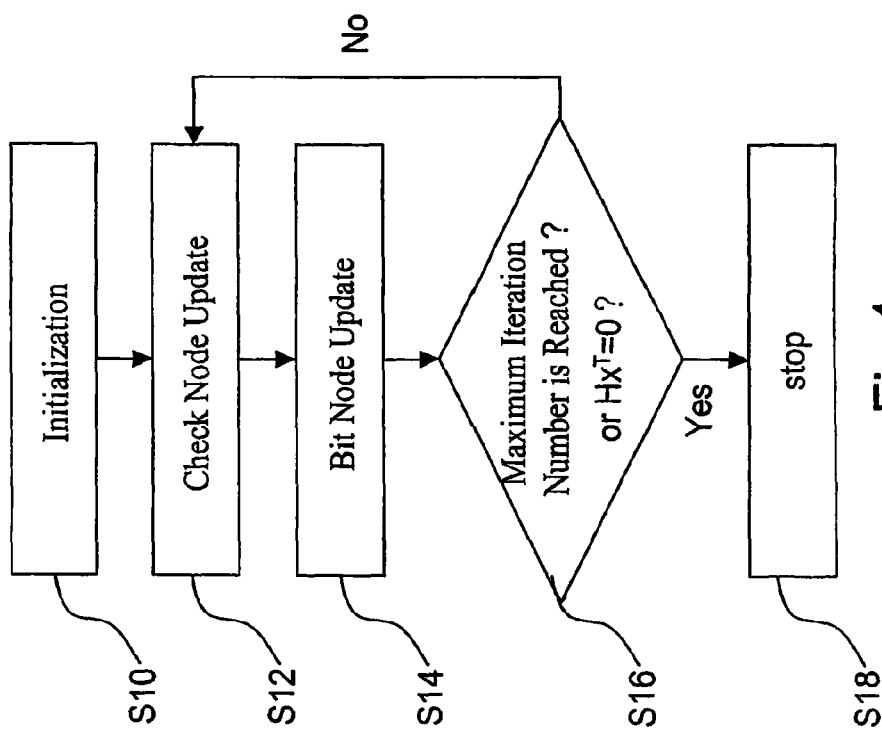
FIG. 1 is a flowchart of the decoding process of a prior art LDPC decoder.
Figure 2:
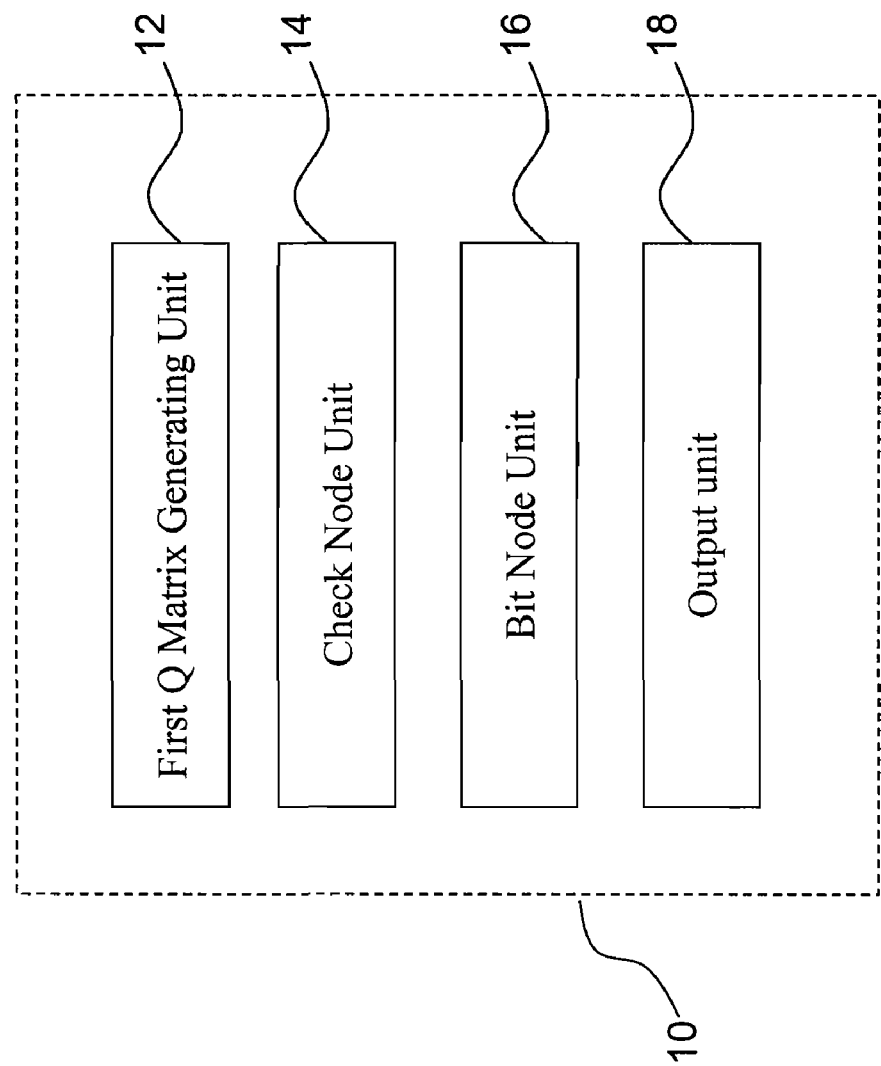
FIG. 2 is a diagram showing the architecture of an LDPC decoder.

Refer to FIG. 2 a diagram showing the architecture of an LDPC decoding device 10, which utilizes c-bit codewords transmitted via a channel and an LDPC matrix to perform LDPC decoding. The LDPC decoding device 10 comprises a first Q matrix generating unit 12, a CNU (Check Node Unit) 14, a (Bit Node Unit) BNU 16 and an output unit 18. The first Q matrix generating unit 12 receives a codeword and a pxc parity-check matrix; when one element in one row of the parity-check matrix has the value of 1, the first Q matrix generating unit 12 substitutes the element with the code-bit value of the c-bit codeword at the corresponding position to form a first Q matrix. The CNU 14 receives the first Q matrix generated by the first Q matrix generating unit 12 and generates an R matrix. After receiving the R matrix, the BNU 16 generates a second Q matrix via substituting each non-zero element of the R matrix with the sum of the values of the non-zero elements except the non-zero element at the same column of the codeword; then, the BNU 16 outputs the second Q matrix to the CNU 14. The output unit 18 receives the R matrix and sums up the elements of each column of the R matrix to determine a code bit and then outputs a decoded codeword with c code bits.

Figure 3:
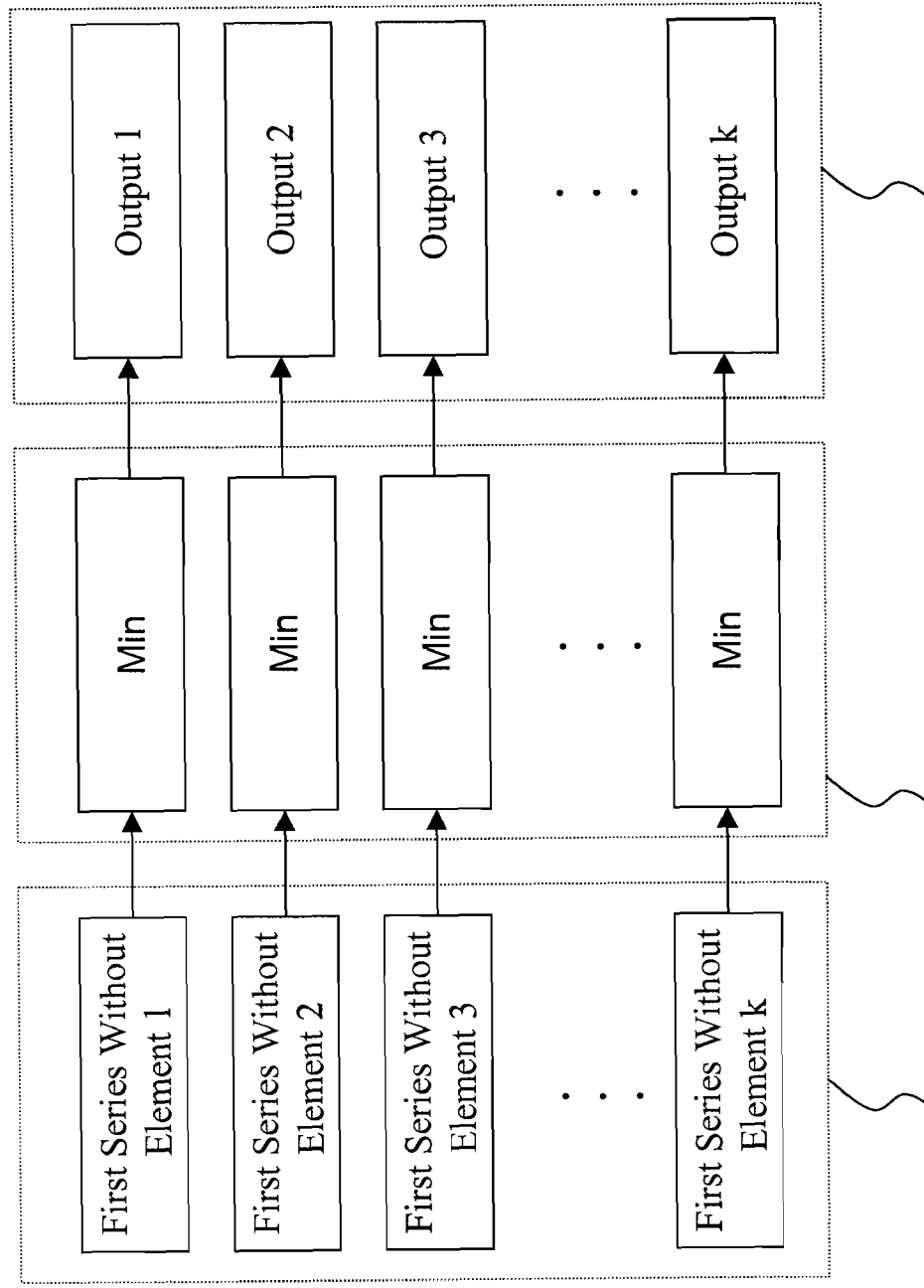
FIG. 3 is a flowchart showing the process of generating first level sequences of an LDPC decoder according to the cyclic comparison method of the present invention.
Figure 4:
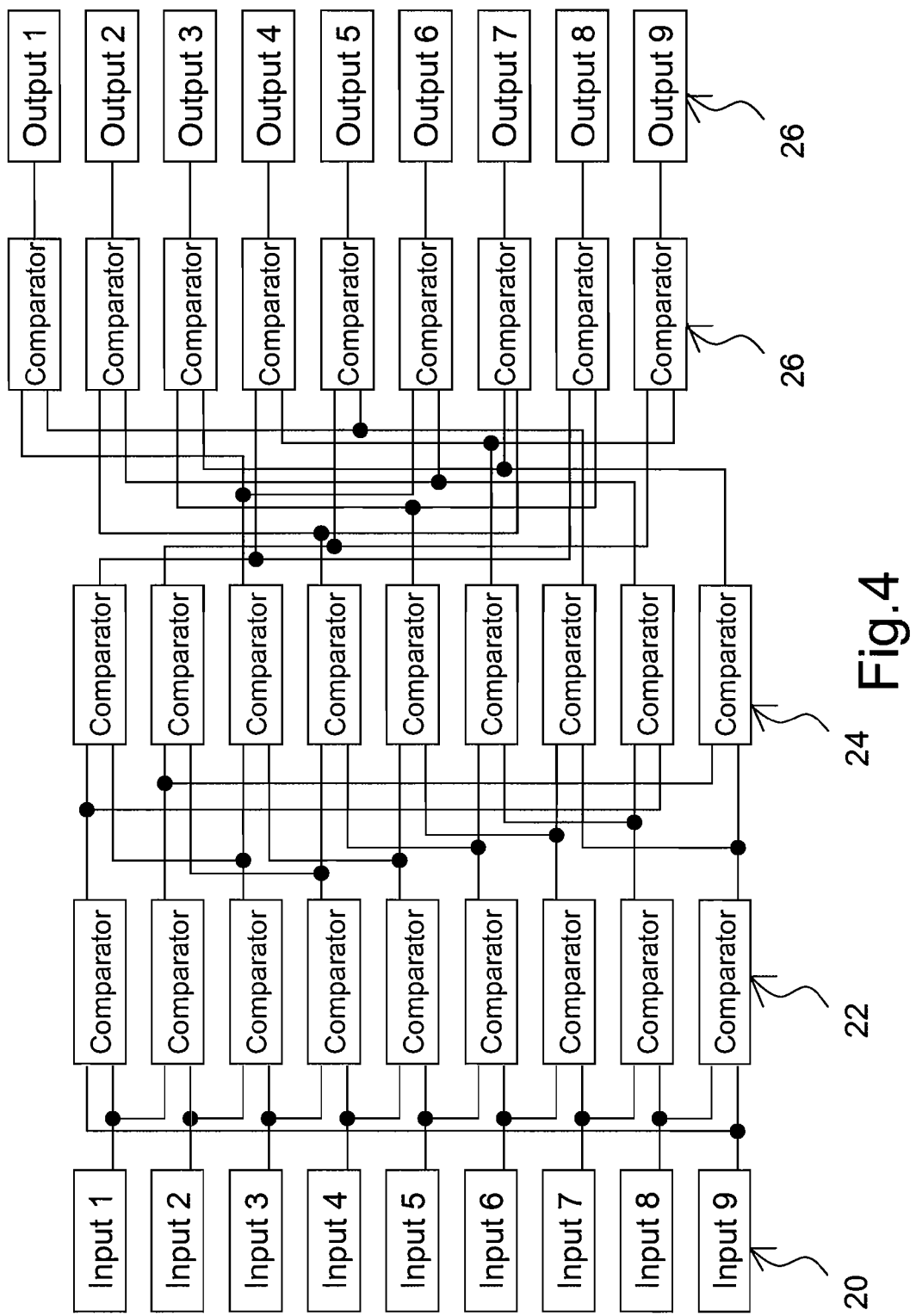
FIG. 4 is a diagram schematically showing that the cyclic comparison method of the present invention is applied to an LDPC decoder.

The cyclic comparison method for an LDPC decoder of the present invention is applied to the CNU 14. K elements are input to the CNU for comparison. Refer to FIG. 3. In Step 20, the elements respectively at from the first position to the kth position are sequentially removed to obtain k first level sequences with each first level sequences having (k−1) elements. In Step 22, the minimum value of each first level sequences is obtained. In Step 24, the first level sequences and the minimum value of each first level sequences are output. When k=9, the output 9 first level sequences are $\{2,3,\ldots,8,9\}$, $\{1,3,4,\ldots,8,9\}$, $\{1,2,4,5,\ldots,8,9\}$, $\{1,2,3,5,6,\ldots,8,9\}$, $\{1,2,3,4,6,7,8,9\}$, $\{1,2,\ldots,5,7,8,9\}$, $\{1,2,\ldots,6,8,9\}$, $\{1,2,\ldots,6,7,9\}$, and $\{1,2,3,\ldots,7,8\}$. The minimum values of the first level sequences are $\text{Min}\{2,3,\ldots,8,9\}$, $\text{Min}\{1,3,4,\ldots,8,9\}$, $\text{Min}\{1,2,4,5,\ldots,8,9\}$, $\text{Min}\{1,2,3,5,6,\ldots,8,9\}$, $\text{Min}\{1,2,3,4,6,7,8,9\}$, $\text{Min}\{1,2,\ldots,5,7,8,9\}$, $\text{Min}\{1,2,\ldots,6,8,9\}$, $\text{Min}\{1,2,\ldots,6,7,9\}$, and $\text{Min}\{1,2,3,\ldots,7,8\}$.

After the abovementioned k outputs have been generated from the k elements input to the CNU, pairs of two elements sequentially selected from the k elements input to the CNU are used to form k second level sequences. When k=9, pairs of two elements sequentially selected from the first input 20 to the ninth input 20 are used to form 9 second level sequences in the first-level comparators 22, including $\text{Min}\{1,2\}$, $\text{Min}\{2,3\}$, $\text{Min}\{3,4\}$, $\text{Min}\{4,5\}$, $\text{Min}\{5,6\}$, $\text{Min}\{6,7\}$, $\text{Min}\{7,8\}$, $\text{Min}\{8,9\}$, and $\text{Min}\{9,1\}$. Next, pairs of two second level sequences sequentially selected from the 9 second level sequences are used to form 9 third level sequences in the second level comparators 24, including $\text{Min}\{9,1,2,3\}$, $\text{Min}\{1,2,3,4\}$, $\text{Min}\{2,3,4,5\}$, $\text{Min}\{3,4,5,6\}$, $\text{Min}\{4,5,6,7\}$, $\text{Min}\{5,6,7,8\}$, $\text{Min}\{6,7,8,9\}$, $\text{Min}\{7,8,9,1\}$, and $\text{Min}\{8,9,1,2\}$. Next, pairs of two third level sequences selected from the 9 third level sequences are used to form 9 output results, and each output results has 8 elements. Then, the output results are compared with the first level sequences output beforehand to determine whether they are identical; if they are identical, the process stops; if they are not identical, the preceding step repeats.

In the abovementioned steps, all the values of the elements of each level sequences are non-zero. The number of the elements of the second level sequences, the third level sequences or the succeeding level sequences is equal to 2 to the nth power, wherein n is the number of the combinations for the level sequences. Therefore, the output results must possess an even number of elements. At the same time, the output results are obtained via combining two third level sequences and repeating the step until obtaining the level sequences containing (k−1) elements. When the input number k is an even number, the lastly-output output results should have (k−1) elements, and (k−1) is an odd number, which conflicts with that the output results should possess an even number of elements. Therefore, when k is an even number, two third level sequences containing a repeated element are combined to obtain one output results having an odd number of elements. For example, when k=8, two third level sequences $\{2,3,4,5\}$ and $\{5,6,7,8\}$ are combined to form the output results $\{2,3,4,5,6,7,8\}$. In the present invention, the number of the required comparators is $k \times \lceil \log_2(k-1) \rceil$, and the number of the levels of comparators is $\lceil \log_2(k-1) \rceil$, i.e. the number of the combinations each output results has to pass through is $\lceil \log_2(k-1) \rceil$.

In summary, the present invention proposes a cyclic comparison method for an LDPC decoder, wherein the cyclic comparison algorithm can be easily programmed, can approach the optimal solution and can accept any number of inputs in a low-density parity-check process. Further, via the large set intersection between the compared level sequences, k input elements need only $k \times \lceil \log_2(k-1) \rceil$ comparisons; thereby, the number of calculations can be reduced, and the efficiency of the system is promoted.

Those described above are the preferred embodiments to exemplify the present invention. However, it is not intended to limit the scope of the present invention. Any equivalent modification or variation according to the spirit of the present invention is to be also included within the scope of the present invention.

What is claimed is:

1. A cyclic comparison method for a processor in a low-density parity-check decoder, including a check node unit which receives a matrix having k elements, where k is an integer, compares the elements in each row of the matrix and outputs a result for generating a code bit and a decoding codeword, said method comprising the following steps:
    (a) sequentially removing one said element respectively at from first position to kth position to obtain k first level sequences with each said first level sequences having (k−1) elements, and outputting said first level sequences and a minimum value of each said first level sequences;
    (b) utilizing two said elements sequentially selected from said k elements input to said check node unit to form k second level sequences, and utilizing pairs of two said second level sequences sequentially selected from said k second level sequences to form k third level sequences;
    (c) utilizing pairs of two said third level sequences to form a plurality level sequences, and repeating step until obtaining k output results with each said output results containing (k−1) elements; and
    (d) comparing said output results obtained in Step (c) and said first level sequences obtained in Step (a) to determine whether they are identical; if they are identical, stopping process and outputting a minimum value of each said output results; if they are not identical, doing Step (c) again to obtain new output results until said new output results are identical to said first level sequences.

2. The cyclic comparison method for a low-density parity-check decoder according to claim 1, wherein the values of said elements are greater than 0.

3. The cyclic comparison method for a low-density parity-check decoder according to claim 1, wherein either of said second level sequences and said third level sequences has an even number of said elements.

4. The cyclic comparison method for a low-density parity-check decoder according to claim 1, wherein when k is an even number, two level sequences having a repeated element are used to form one said output results having an odd number of said elements.

5. The cyclic comparison method for a low-density parity-check decoder according to claim 1, wherein in said first level sequences, the values of said elements are set to be 1 except said element with a second minimum value, and said minimum value substitutes said second minimum values.

6. The cyclic comparison method for a low-density parity-check decoder according to claim 1, wherein a plurality of said first level sequences forms a check matrix.

7. The cyclic comparison method for a low-density parity-check decoder according to claim 1, wherein the combinations and comparisons of said second level sequences, said third level sequences, said output results, and the level sequences formed in the process generating said output results are implemented with a plurality of comparators.

8. The cyclic comparison method for a low-density parity-check decoder according to claim 7, wherein number of said comparators is $k \times \lceil \log_2(k-1) \rceil$.

9. The cyclic comparison method for a low-density parity-check decoder according to claim 7, wherein said comparators output said minimum values.

10. The cyclic comparison method for a low-density parity-check decoder according to claim 1, wherein number of the combination/comparison operations to obtain one said output results is $\lceil \log_2(k-1) \rceil$.

* * * * *